US011171000B2

(12) United States Patent
Seo et al.

(10) Patent No.: US 11,171,000 B2
(45) Date of Patent: Nov. 9, 2021

(54) LASER CRYSTALLIZATION SYSTEM AND LASER CRYSTALLIZATION METHOD

(71) Applicant: Samsung Display Co., LTD., Yongin-si (KR)

(72) Inventors: Jongoh Seo, Seoul (KR); Jonghoon Choi, Hwaseong-si (KR); Ji-Hwan Kim, Hwaseong-si (KR); Byung Soo So, Yongin-si (KR); Dong-Min Lee, Yongin-si (KR); Dong-Sung Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/864,812

(22) Filed: May 1, 2020

(65) Prior Publication Data

US 2020/0388493 A1     Dec. 10, 2020

(30) Foreign Application Priority Data

Jun. 7, 2019 (KR) .......................... 10-2019-0067318

(51) Int. Cl.
*H01L 21/02* (2006.01)

(52) U.S. Cl.
CPC .. *H01L 21/02686* (2013.01); *H01L 21/02532* (2013.01)

(58) Field of Classification Search
None
See application file for complete search history.

(56) References Cited

U.S. PATENT DOCUMENTS

| | | | | |
|---|---|---|---|---|
| 2003/0036251 A1* | 2/2003 | Mitsuhashi | ......... | H01L 21/2026 438/487 |
| 2004/0241922 A1* | 12/2004 | Toida | .................. | B23K 26/064 438/166 |
| 2006/0279744 A1* | 12/2006 | Takeda | ............... | G01B 11/0633 356/503 |
| 2014/0120704 A1* | 5/2014 | Kim | ....................... | H01L 22/12 438/487 |

FOREIGN PATENT DOCUMENTS

| KR | 10-0278977 | 2/2001 |
|---|---|---|
| KR | 10-2014-0056709 | 5/2014 |

OTHER PUBLICATIONS

N. Budini et al., "Influence of microstructure and hydrogen concentration on amorphous silicon crystallization", Thin Solid Films, Apr. 10, 2010, pp. 5349-5354, vol. 518, Elsevier.

* cited by examiner

Primary Examiner — Bo B Jang
(74) Attorney, Agent, or Firm — Kile Park Reed & Houtteman PLLC (57) ABSTRACT

A laser crystallization system includes a transfer part that transfers a substrate on which an amorphous silicon thin film is deposited into a chamber, a laser irradiation part that irradiates an excimer laser to the substrate for crystallization of the amorphous silicon thin film in the chamber, a stage that supports the substrate in the chamber, a measuring part that measures a light transmittance value of the substrate, and a controller that controls the laser irradiation part to irradiate the excimer laser to the substrate when the light transmittance value is equal to or lower than a reference transmittance value and controls the laser irradiation part not to irradiate the excimer laser to the substrate when the light transmittance value is higher than the reference transmittance value.

4 Claims, 5 Drawing Sheets

LASER CRYSTALLIZATION SYSTEM AND LASER CRYSTALLIZATION METHOD

CROSS-REFERENCE TO RELATED APPLICATION(S)

This application claims priority to and benefit of Korean Patent Application No. 10-2019-0067318, filed on Jun. 7, 2019 in the Korean Intellectual Property Office, the contents of which are incorporated herein by reference in its entirety.

BACKGROUND

Technical Field

Embodiments relate generally to a laser crystallization system and a laser crystallization method that irradiate an excimer laser to an amorphous silicon thin film for crystallization of the amorphous silicon thin film to form a polycrystalline silicon thin film.

Description of the Related Art

As high performance of an element is required according to enlargement of a display device and high-definition of the display device, a high performance thin film transistor with high electron mobility is required. Accordingly, a polycrystalline silicon thin film transistor which has higher performance than performance of an amorphous silicon thin film transistor has been studied recently. The polycrystalline silicon thin film transistor has electron mobility of tens to hundreds of $cm^2/Vs$, so that a data driving circuit or a peripheral circuit that require high electron mobility may be embedded on a substrate. The polycrystalline silicon thin film transistor may include a small channel, so that the aperture ratio of a screen may be increased. In general, the polycrystalline silicon thin film transistor may be manufactured by crystallizing the amorphous silicon ("a-Si") thin film after depositing the amorphous silicon thin film on the substrate. For crystallizing the amorphous silicon thin film, an excimer laser is irradiated to the amorphous silicon thin film to form the polycrystalline silicon thin film in an excimer laser annealing ("ELA") crystallization method. In this method, when the excimer laser is irradiated to the amorphous silicon thin film when the amorphous silicon thin film is not normally deposited on the substrate or a concentration of hydrogen remaining in the amorphous silicon thin film is higher than a normal reference value, a film floating phenomenon may occur due to a portion where the amorphous silicon thin film is not deposited or due to hydrogen remaining in the amorphous silicon thin film, and a chamber and/or an annealing window may be contaminated. When the film floating phenomenon occurs, the thin film may be discarded because airflow stain occurs on the polycrystalline silicon thin film. When the chamber and/or the annealing window are contaminated, a significant cost loss may occur because laser crystallization facility checks (e.g., replacement of an annealing window, cleaning of a chamber, etc.) may be performed.

SUMMARY

Some embodiments provide a laser crystallization system preventing excimer laser from being irradiated to an amorphous silicon thin film when the amorphous silicon thin film is not normally deposited on a substrate or a concentration of hydrogen remaining in the amorphous silicon thin film is higher than a normal reference value.

Some embodiments provide a laser crystallization method preventing excimer laser from being irradiated to an amorphous silicon thin film when the amorphous silicon thin film is not normally deposited on a substrate or a concentration of hydrogen remaining in the amorphous silicon thin film is higher than a normal reference value.

According to an embodiment, a laser crystallization system may include a transfer part that transfers a substrate on which an amorphous silicon thin film is deposited into a chamber, a laser irradiation part that irradiates an excimer laser to the substrate for crystallization of the amorphous silicon thin film in the chamber, a stage that supports the substrate in the chamber, a measuring part that measures a light transmittance value of the substrate, and a controller that controls the laser irradiation part to irradiate the excimer laser to the substrate when the light transmittance value is equal to or lower than a reference light transmittance value and controls the laser irradiation part not to irradiate the excimer laser to the substrate when the light transmittance value is higher than the reference light transmittance value.

In an embodiment, the measuring part may be disposed outside the chamber, and the controller may control the transfer part to transfer the substrate into the chamber and control the laser irradiation part to irradiate the excimer laser to the substrate when the light transmittance value is equal to or lower than the reference light transmittance value, and may control the transfer part not to transfer the substrate into the chamber or control the laser irradiation part not to irradiate the excimer laser to the substrate when the light transmittance value is higher than the reference light transmittance value.

In an embodiment, the reference light transmittance value may be set to a maximum light transmittance value to decide the substrate as a normal substrate.

In an embodiment, the reference light transmittance value may be set to an average value of light transmittance values of previous substrates.

In an embodiment, the measuring part may be disposed between the laser irradiation part and an inlet of the chamber.

In an embodiment, the measuring part may be disposed at an inlet of the chamber.

In an embodiment, the laser crystallization system may further include a cleaner that cleans the substrate before the substrate is transferred into the chamber.

In an embodiment, the measuring part may be disposed inside the cleaner, at an inlet of the cleaner, or at an outlet of the cleaner, and the controller may control the transfer part to transfer the substrate into the chamber and control the laser irradiation part to irradiate the excimer laser to the substrate when the light transmittance value is equal to or lower than the reference light transmittance value, and may control the transfer part not to transfer the substrate into the chamber or control the laser irradiation part not to irradiate the excimer laser to the substrate when the light transmittance value is higher than the reference light transmittance value.

According to an embodiment, a laser crystallization system may include a transfer part that transfers a substrate on which an amorphous silicon thin film is deposited into a chamber, a laser irradiation part that irradiates an excimer laser to the substrate for crystallization of the amorphous silicon thin film in the chamber, a stage that supports the substrate in the chamber, a measuring part that measures a light reflectance value of the substrate, and a controller that controls the laser irradiation part to irradiate the excimer laser to the substrate when the light reflectance value is equal to or higher than a reference reflectance value and controls the laser irradiation part not to irradiate the excimer laser to the substrate when the light reflectance value is lower than the reference reflectance value.

In an embodiment, the measuring part may be disposed outside the chamber, the controller may control the transfer part to transfer the substrate into the chamber and controls the laser irradiation part to irradiate the excimer laser to the substrate when the light reflectance value is equal to or higher than the reference reflectance value and may control the transfer part not to transfer the substrate into the chamber or control the laser irradiation part not to irradiate the excimer laser to the substrate when the light reflectance value is lower than the reference reflectance value.

In an embodiment, the reference reflectance value may be set to a minimum light reflectance value to decide the substrate as a normal substrate.

In an embodiment, the reference reflectance value may be set to an average value of light reflectance values of previous substrates.

In an embodiment, the measuring part may be disposed between the laser irradiation part and an inlet of the chamber.

In an embodiment, the measuring part may be disposed at an inlet of the chamber.

In an embodiment, the laser crystallization system may further include a cleaner that cleans the substrate before the substrate is transferred into the chamber.

In an embodiment, the measuring part may be disposed inside the cleaner, at an inlet of the cleaner, or at an outlet of the cleaner, and the controller may control the transfer part to transfer the substrate into the chamber and control the laser irradiation part to irradiate the excimer laser to the substrate when the light reflectance value is equal to or higher than the reference reflectance value and may control the transfer part not to transfer the substrate into the chamber or control the laser irradiation part not to irradiate the excimer laser to the substrate when the light reflectance value is lower than the reference reflectance value.

According to an embodiment, a laser crystallization method may include measuring a light transmittance value of a substrate on which an amorphous silicon thin film is deposited, comparing the light transmittance value with a reference light transmittance value, forming a polycrystalline silicon thin film by crystallizing the amorphous silicon thin film by irradiating an excimer laser to the substrate when the light transmittance value is equal to or less than the reference light transmittance value and controlling not to irradiate the excimer laser to the substrate when the light transmittance value is higher than the reference light transmittance value.

In an embodiment, a laser crystallization method may further include reducing a concentration of hydrogen remaining in the amorphous silicon thin film when the light transmittance value is higher than the reference light transmittance value.

In an embodiment, the reference light transmittance value may be set to a maximum light transmittance value to decide the substrate as a normal substrate.

In an embodiment, the reference light transmittance value may be set to an average value of light transmittance values of previous substrates.

A laser crystallization system according to the embodiments may detect a defective substrate on which an amorphous silicon thin film is not normally deposited or whose concentration of hydrogen remaining in the amorphous silicon thin film is higher than a normal reference value in real time and may prevent a film floating phenomenon which may occur when an excimer laser is irradiated to the defective substrate, or when there is contamination of a chamber and/or an annealing window, by including a transfer part that transfers a substrate on which the amorphous silicon thin film is deposited into the chamber, a laser irradiation part that irradiates the excimer laser to the substrate for crystallization of the amorphous silicon thin film in the chamber, a stage that supports the substrate in the chamber, a measuring part that measures a light transmittance value of the substrate, and a controller that controls the laser irradiation part to irradiate the excimer laser to the substrate when the light transmittance value is equal to or lower than a reference light transmittance value and controls the laser irradiation part not to irradiate the excimer laser to the substrate when the light transmittance value is higher than the reference light transmittance value.

A laser crystallization system according to the embodiments may detect a defective substrate on which an amorphous silicon thin film is not normally deposited or whose concentration of hydrogen remaining in the amorphous silicon thin film is higher than a normal reference value in real time and may prevent a film floating phenomenon which may occur when an excimer laser is irradiated to the defective substrate, or when there is contamination of a chamber and/or an annealing window, by including a transfer part that transfers a substrate on which the amorphous silicon thin film is deposited into the chamber, a laser irradiation part that irradiates the excimer laser to the substrate for crystallization of the amorphous silicon thin film in the chamber, a stage that supports the substrate in the chamber, a measuring part that measures a light reflectance value of the substrate, and a controller that controls the laser irradiation part to irradiate the excimer laser to the substrate when the light reflectance value is equal to or higher than a reference reflectance value and controls the laser irradiation part not to irradiate the excimer laser to the substrate when the light reflectance value is higher than the reference reflectance value.

A laser crystallization method according to the embodiments may detect a defective substrate on which an amorphous silicon thin film is not normally deposited or whose concentration of hydrogen remaining in the amorphous silicon thin film is higher than a normal reference value in real time and may prevent a film floating phenomenon which may occur when an excimer laser is irradiated to the defective substrate, or when there is contamination of a chamber and/or an annealing window, by measuring a light transmittance value of a substrate on which an amorphous silicon thin film is deposited, comparing the light transmittance value to a reference light transmittance value, forming a polycrystalline silicon thin film by crystallizing the amorphous silicon thin film by irradiating an excimer laser to the substrate when the light transmittance value is equal to or lower than the reference light transmittance value, and controlling not to irradiate the excimer laser to the substrate when the light transmittance value is higher than the reference light transmittance value.

BRIEF DESCRIPTION OF THE DRAWINGS

Illustrative, non-limiting embodiments of the invention will be more clearly understood from the following detailed description in conjunction with the accompanying drawings.

DETAILED DESCRIPTION OF THE EMBODIMENTS

Advantages and features of the disclosure and methods for accomplishing the same will be more clearly understood from embodiments described below with reference to the accompanying drawings. However, the disclosure is not limited to the following embodiments but may be implemented in various forms. The embodiments are provided only to complete the disclosure and to fully provide a person having ordinary skill in the art to which the disclosure pertains within the field of the disclosure.

It will be understood that when an element, such as a layer, film, region, substrate, or area is referred to as being "on" another element, it may be directly on or another element or intervening elements may be present therebetween.

In the drawings, sizes and thicknesses of elements may be enlarged for better understanding, clarity, and ease of description thereof. However, the disclosure is not limited to the illustrated sizes and thicknesses. In the drawings, for better understanding and ease of description, the thicknesses of layers, films, panels, regions, and other elements, may be exaggerated for clarity.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the inventive concept will be explained in detail with reference to the accompanying drawings.

Figure 1:
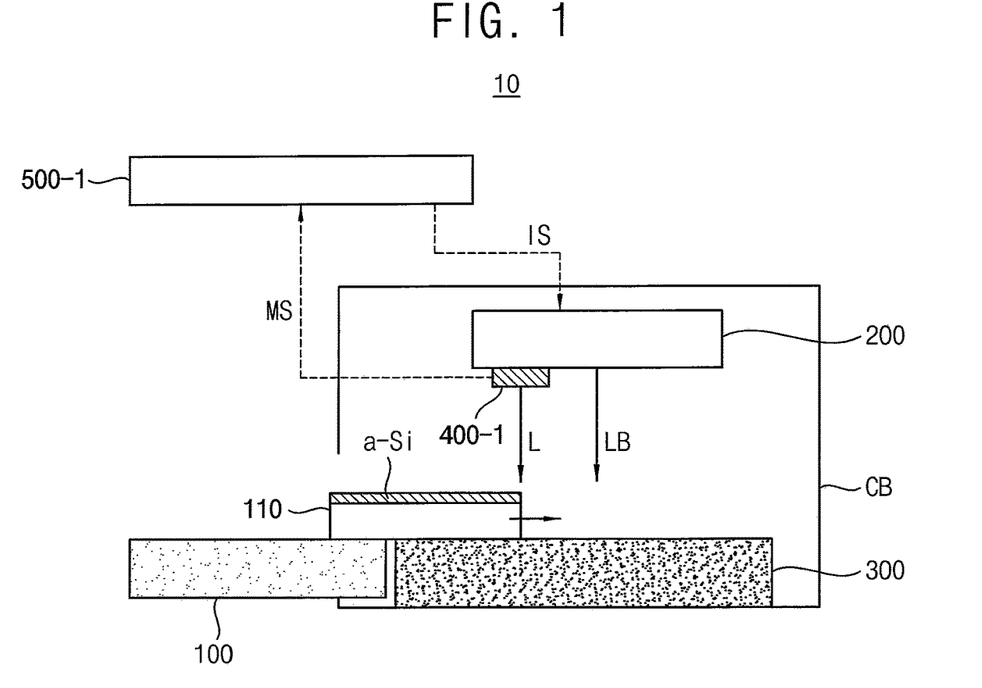
FIG. 1 is a schematic cross-sectional view illustrating a laser crystallization system according to an embodiment.

FIG. 1 is a schematic cross-sectional view illustrating a laser crystallization system according to an embodiment.

Referring to FIG. 1, the laser crystallization system 10 may include a transfer part 100, a laser irradiation part 200, a stage 300, a measuring part 400-1 and a controller 500-1.

The transfer part 100 may transfer a substrate 110 on which an amorphous silicon thin film is deposited into a chamber CB. The substrate 110 may include a transparent material or an opaque material (e.g., glass or plastic, etc.). For example, the substrate 110 may include a polyimide material. The amorphous silicon thin film may be deposited on the substrate 110 by low pressure chemical vapor deposition, atmospheric pressure chemical vapor deposition, plasma enhanced chemical vapor deposition, sputtering, vacuum deposition, or the like.

The laser irradiation part 200 may perform a crystallization process by irradiating an excimer laser LB generated intermittently to the substrate 110 on which the amorphous silicon thin film is deposited. The excimer laser LB may have a short wavelength, a high power and a high efficiency. The excimer laser LB may include an inert gas (e.g., $Ar_2$, $Kr_2$, $Xe_2$, etc.), an inert gas halide (e.g., ArF, ArCl, KrF, KrCl, XeF, XeCl, etc.), a halogenated mercury (e.g., HgCl, HgBr, HgI, etc.), an inert gas oxygenate compound (e.g., ArO, KrO, XeO, etc.), a polyatomic excimer (e.g., $Kr_2F$, $Xe_2F$), or the like.

The crystallization process is a process of melting and recrystallizing the amorphous silicon thin film by cooling the temperature of the amorphous silicon thin film after raising the temperature of the amorphous silicon thin film by irradiating the excimer laser LB for nanoseconds from the laser irradiation part 200 to the substrate 110 on which the amorphous silicon thin film is deposited.

The substrate 110 on which the amorphous silicon thin film is deposited may be classified into a normal substrate and a defective substrate. The amorphous silicon thin film may be normally deposited on the normal substrate and the normal substrate may have a concentration of hydrogen remaining in the amorphous silicon thin film lower than a normal reference value. In contrast, the amorphous silicon thin film may not be normally deposited on the defective substrate or the defective substrate may have a concentration of hydrogen remaining in the amorphous silicon thin film that is higher than the normal reference value. In an embodiment, the normal reference value may be about 3 at % (atomic percent), but this may vary according to process conditions. For example, the normal reference value may vary when a thickness of the substrate varies, a thickness of the amorphous silicon thin film deposited on the substrate varies, or a metal layer is inserted between the substrate and the amorphous silicon thin film. When the excimer laser LB is irradiated to the defective substrate, a film floating phenomenon may occur by a portion where the amorphous silicon thin film is not normally deposited or hydrogen remaining in the amorphous silicon thin film, and a chamber and/or an annealing window may be contaminated.

The stage 300 may support the substrate 110 so that the excimer laser LB may be scanned to the entirety of the substrate 110. The chamber CB may include the laser irradiation part 200 and the stage 300, For example, the laser irradiation part 200 and the stage 300 may be installed to the upper and lower portions in the chamber CB, respectively. The interior of the chamber CB may be formed with a sealed box to prevent contamination of the excimer laser LB and to stabilize the crystallization process, and an inert gas (e.g., nitrogen ($N_2$) gas, etc.) may be filled in the chamber CB.

The measuring part 400-1 may include a measuring tool capable of measuring a light transmittance value of the substrate 110. The measuring part 400-1 may be disposed between the laser irradiation part 200 and an inlet of the chamber CB, and measure the light transmittance value of the substrate 110 transferred into the chamber CB. The measuring part 400-1 may measure the light transmittance value of the substrate 110 and may transmit a measurement signal MS including the light transmittance value to the controller 500-1.

The light transmittance value of a portion where the amorphous silicon thin film is not normally deposited on the substrate 110 may be higher than the light transmittance value of a portion where the amorphous silicon thin film is normally deposited on the substrate 110. The light transmittance value of the substrate 110 having a high concentration of hydrogen remaining in the amorphous silicon thin film may be higher than the light transmittance value of the substrate 110 having a low concentration of hydrogen remaining in the amorphous silicon thin film. That is, the light transmittance value of the defective substrate may be higher than the light transmittance value of the normal substrate.

The controller 500-1 may receive the measurement signal MS including the light transmittance value of the substrate 110 on which the amorphous silicon thin film is deposited from the measuring part 400-1 and may compare the light transmittance value of the substrate 110 to a reference light transmittance value. The controller 500-1 may determine whether the substrate 110 is a normal substrate or a defective substrate in real time by comparing the light transmittance value of the substrate 110 to the reference light transmittance value. The controller 500-1 may control the laser irradiation part 200. For example, when the light transmittance value of the substrate 110 is equal to or lower than the reference light transmittance value, the controller 500-1 may determine the substrate 110 as a normal substrate having a concentration of hydrogen remaining in the amorphous silicon thin film equal to or lower than the normal reference value and may control the laser irradiation part 200 by applying an irradiation signal IS to the laser irradiation part 200 so that the laser irradiation part 200 irradiates the excimer laser LB to the substrate 110. When the light transmittance value of the substrate 110 is higher than the reference light transmittance value, the controller 500-1 may determine the substrate 110 as a defective substrate having the concentration of hydrogen remaining in the amorphous silicon thin film higher than the normal reference value and control the laser irradiation part 200 by applying the irradiation signal IS to the laser irradiation part 200 so that the laser irradiation part 200 does not irradiate the excimer laser LB to the substrate 110.

An element may be added to a lower portion of the amorphous silicon thin film. For example, a buffer layer may be formed to prevent penetration of impurity elements from a substrate and to planarize a surface. For example, a metal layer may be formed to improve performance of a display device. In other embodiments, the light transmittance value of the substrate 110 may also vary when the structure of the substrate 110 is changed. Even if the structure of the substrate 110 is changed, the laser crystallization system 10 of the embodiment may be performed by changing the reference light transmittance value.

In an embodiment, the reference light transmittance value may be set to a maximum light transmittance value to decide the substrate 110 as a normal substrate. The controller 500-1 may receive the measurement signal MS including the light transmittance value of the substrate 110 on which the amorphous silicon thin film is deposited from the measuring part 400-1 and may compare the light transmittance value of the substrate 110 to the maximum light transmittance value. The controller 500-1 may determine whether the substrate 110 is a normal substrate or a defective substrate in real time by comparing the light transmittance value of the substrate 110 to the maximum light transmittance value. The controller 500-1 may control the laser irradiation part 200. For example, when the light transmittance value of the substrate 110 is equal to or lower than the maximum light transmittance value, the controller 500-1 may determine the substrate 110 as a normal substrate having the concentration of hydrogen remaining in the amorphous silicon thin film equal to or lower than the normal reference value and may control the laser irradiation part 200 by applying the irradiation signal IS to the laser irradiation part 200 so that the laser irradiation part 200 irradiates the excimer laser LB to the substrate 110. When the light transmittance value of the substrate 110 is higher than the maximum light transmittance value, the controller 500-1 may determine the substrate 110 as a defective substrate having the concentration of hydrogen remaining in the amorphous silicon thin film higher than the normal reference value and may control the laser irradiation part 200 by applying the irradiation signal IS to the laser irradiation part 200 so that the laser irradiation part 200 does not irradiate the excimer laser LB to the substrate 110.

In an embodiment, the reference light transmittance value is set to an average value of light transmittance values of previous substrates. The controller 500-1 may receive the measurement signal MS including the light transmittance value of the substrate 110 on which the amorphous silicon thin film is deposited from the measuring part 400-1 and may compare the light transmittance value of the substrate 110 to the average value of light transmittance values of previous substrates. The controller 500-1 may determine whether the substrate 110 is a normal substrate or a defective substrate in real time by comparing the light transmittance value of the substrate 110 to the average value of light transmittance values of previous substrates. The controller 500-1 may control the laser irradiation part 200. For example, when the light transmittance value of the substrate 110 is equal to or lower than the average value of light transmittance values of previous substrates, the controller 500-1 may determine the substrate 110 as a normal substrate having the concentration of hydrogen remaining in the amorphous silicon thin film equal to or lower than the normal reference value and may control the laser irradiation part 200 by applying the irradiation signal IS to the laser irradiation part 200 so that the laser irradiation part 200 irradiates the excimer laser LB to the substrate 110. When the light transmittance value of the substrate 110 is higher than the average value of light transmittance values of previous substrates, the controller 500-1 may determine the substrate 110 as a defective substrate having the concentration of hydrogen remaining in the amorphous silicon thin film higher than the normal reference value and may control the laser irradiation part 200 by applying the irradiation signal IS to the laser irradiation part 200 so that the laser irradiation part 200 does not irradiate the excimer laser LB to the substrate 110.

The average value of the light transmittance values of previous substrates may be used especially when it is difficult to use the maximum light transmittance value. For example, a process condition such as a size or a thickness of a substrate entered into the crystallization process, or a thickness of the amorphous silicon thin film may be set to be varied for each process, accordingly the controller 500-1 may set the maximum light transmittance value to be varied for each process condition. The average value of light transmittance values of previous substrates produced in each process may be used. However, embodiments of the inventive concept are not limited thereto, and the average value of the light transmittance values of previous substrates may be variously set as necessary. Further, the reference light transmittance value may be variously set as necessary except for the maximum light transmittance value and the average value of the light transmittance values of previous substrates.

In the above, the laser crystallization system 10 which determines the substrate 110 as a defective substrate by using the light transmittance value of the substrate 110 and does not perform the crystallization process about the defective substrate has been described. However, the inventive concept is not limited thereto. For example, the laser crystallization system 10 may determine that the amorphous silicon thin film is not deposited properly when the light transmittance value of the substrate 110 is higher than the reference light transmittance value, and may control the laser irradiation part 200 by applying the irradiation signal IS to the laser irradiation part 200 so that the laser irradiation part 200 does not irradiate the excimer laser LB to the substrate 110.

Figure 2:
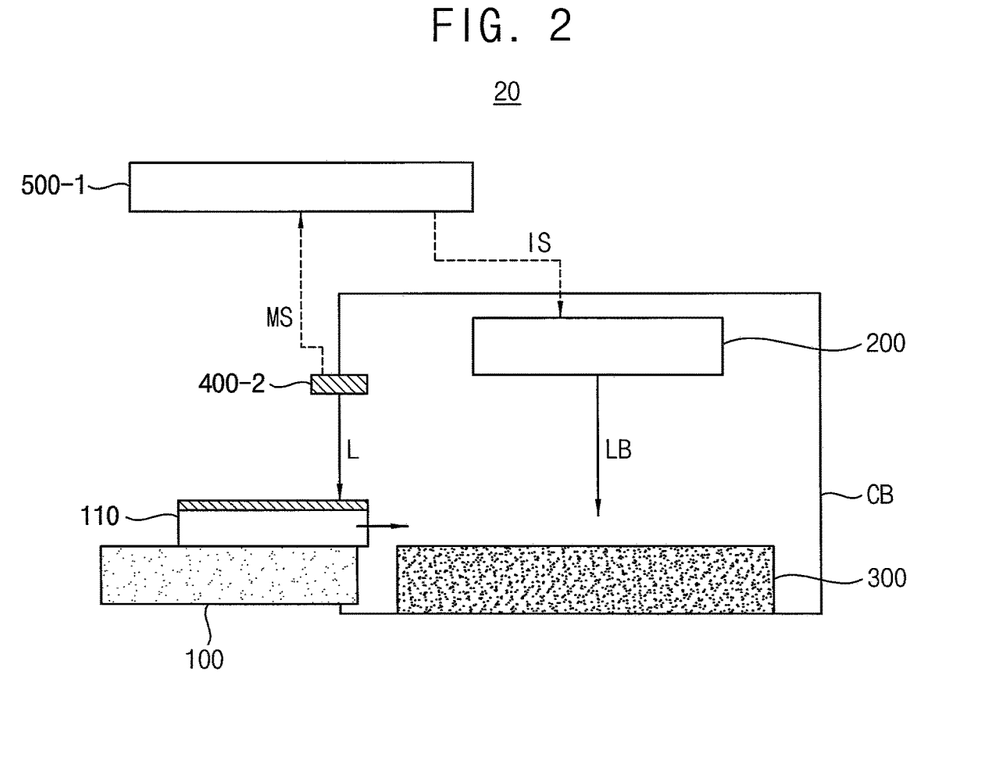
FIG. 2 is a schematic cross-sectional view illustrating a laser crystallization system according to an embodiment.

FIG. 2 is a schematic cross-sectional view illustrating a laser crystallization system according to an embodiment.

Referring to FIG. 2, the laser crystallization system 20 according to an embodiment may include a transfer part 100, a laser irradiation part 200, a stage 300, a measuring part 400-2 and a controller 500-1. However, since the laser crystallization system 20 is substantially the same as the laser crystallization system 10 of FIG. 1 except for a position where the measuring part 400-2 is disposed, the description for the laser crystallization system 20 will emphasize the measuring part 400-2.

The measuring part 400-2 may include a measuring tool capable of measuring a light transmittance value of a substrate 110. The measuring part 400-2 may be disposed at an inlet of a chamber CB and may measure the light transmittance value of the substrate 110 being transferred into the chamber CB. The measuring part 400-2 may measure the light transmittance value of the substrate 110 and may transmit a measurement signal MS including the light transmittance value to the controller 500-1.

The controller 500-1 may receive the measurement signal MS including the light transmittance value of the substrate 110 on which an amorphous silicon thin film is deposited from the measuring part 400-2 and may compare the light transmittance value of the substrate 110 to a reference light transmittance value. The controller 500-1 may determine whether the substrate 110 is a normal substrate or a defective substrate in real time by comparing the light transmittance value of the substrate 110 to the reference light transmittance value. The controller 500-1 may control the laser irradiation part 200. For example, when the light transmittance value of the substrate 110 is equal to or lower than the reference light transmittance value, the controller 500-1 may determine the substrate 110 as a normal substrate having a concentration of hydrogen remaining in the amorphous silicon thin film equal to or lower than the normal reference value and may control the laser irradiation part 200 by applying an irradiation signal IS to the laser irradiation part 200 so that the laser irradiation part 200 irradiates the excimer laser LB to the substrate 110. When the light transmittance value of the substrate 110 is higher than the reference light transmittance value, the controller 500-1 may determine the substrate 110 as a defective substrate having the concentration of hydrogen remaining in the amorphous silicon thin film higher than the normal reference value and may control the laser irradiation part 200 by applying the irradiation signal IS to the laser irradiation part 200 so that the laser irradiation part 200 does not irradiate the excimer laser LB to the substrate 110.

Figure 3:
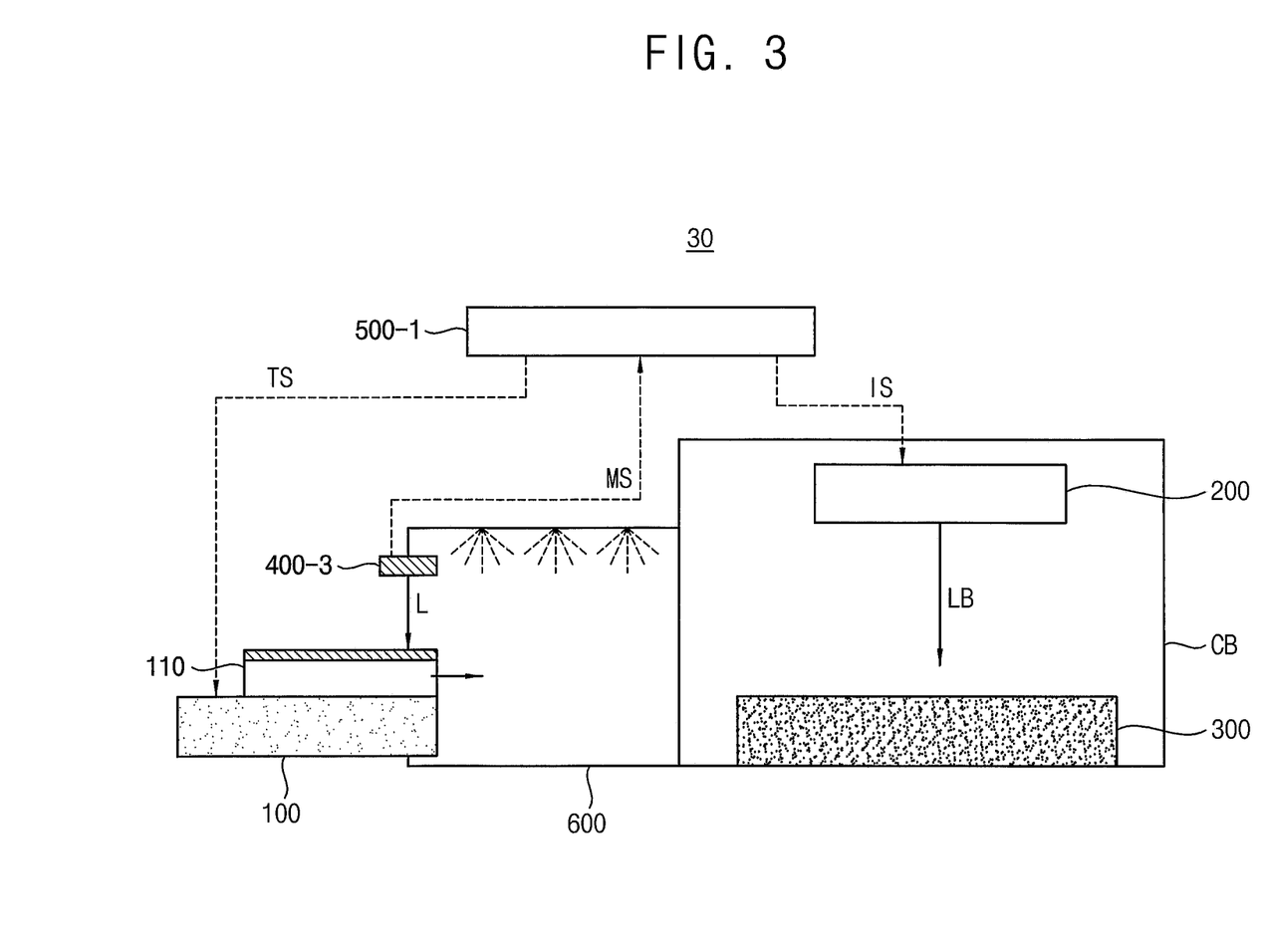
FIG. 3 is a schematic cross-sectional view illustrating a laser crystallization system according to an embodiment.

FIG. 3 is a schematic cross-sectional view illustrating a laser crystallization system according to an embodiment.

Referring to FIG. 3, the laser crystallization system 30 according to an embodiment may include a transfer part 100, a laser irradiation part 200, a stage 300, a measuring part 400-3, a controller 500-1 and a cleaner 600. Compared to the laser crystallization system 10 of FIG. 1, the laser crystallization system 30 of FIG. 3 may further include the cleaner 600, and may change a position where the measuring part 400-3 is disposed. Since the crystallization system 30 is substantially the same as the laser crystallization system 10 of FIG. 1 except for these, the description for the laser crystallization system 30 will emphasize the cleaner 600 and the measuring part 400-3.

The transfer part 100 may transfer a substrate 110 on which an amorphous silicon thin film is deposited into a chamber CB, and may transfer the substrate 110 into the cleaner 600. The cleaner 600 may clean the substrate 110 on which the amorphous silicon thin film is deposited before the substrate 110 is transferred into the chamber CB. A native oxide film may be formed on the amorphous silicon thin film, and the native oxide film may be cleaned using hydrofluoric acid. Hydrofluoric acid may be an aqueous solution in which hydrogen fluoride (HF) is dissolved. For example, hydrofluoric acid may comprise about 0.5% hydrogen fluoride. The cleaner 600 may clean the substrate 110 with hydrofluoric acid to remove the native oxide formed on the amorphous silicon thin film.

The measuring part 400-3 may include a measuring tool capable of measuring a light transmittance value of the substrate 110. The measuring part 400-3 may be disposed inside the cleaner 600, at an inlet of the cleaner 600, or at an outlet of the cleaner 600. As shown in FIG. 3, the measuring part 400-3 may be disposed at the inlet of the cleaner 600. The measuring part 400-3 may be disposed at the inlet of the chamber CB and may measure a light transmittance value of the substrate 110 being transferred into the cleaner 600. The measuring part 400-3 may measure the light transmittance value of the substrate 110 and may transmit a measurement signal MS including the light transmittance value to the controller 500-1.

The controller 500-1 may receive the measurement signal MS including the light transmittance value of the substrate 110 on which an amorphous silicon thin film is deposited from the measuring part 400-3 and may compare the light transmittance value of the substrate 110 to a reference light transmittance value. The controller 500-1 may determine whether the substrate 110 is a normal substrate or a defective substrate in real time by comparing the light transmittance value of the substrate 110 to the reference light transmittance value. The controller 500-1 may control the laser irradiation part 200. For example, when the light transmittance value of the substrate 110 is equal to or lower than the reference light transmittance value, the controller 500-1 may determine the substrate 110 as a normal substrate having a concentration of hydrogen remaining in the amorphous silicon thin film equal to or lower than the normal reference value and may control the laser irradiation part 200 by applying an irradiation signal IS to the laser irradiation part 200 so that the laser irradiation part 200 irradiates the excimer laser LB to the substrate 110. When the light transmittance value of the substrate 110 is higher than the reference light transmittance value, the controller 500-1 may determine the substrate 110 as a defective substrate having the concentration of hydrogen remaining in the amorphous silicon thin film higher than the normal reference value and may control the laser irradiation part 200 by applying the irradiation signal IS to the laser irradiation part 200 so that the laser irradiation part 200 does not irradiate the excimer laser LB to the substrate 110.

The controller 500-1 may also control the transfer part 100 when the measuring part 400-3 is disposed outside the chamber CB. For example, the measuring part 400-3 disposed at the inlet of the cleaner 600 may measure the light transmittance value of the substrate 110 before the substrate 110 is transferred into the chamber CB, and may transmit the measurement signal MS including the light transmittance value to the controller 500-1. Therefore, the controller 500-1 may also control the transfer part 100, because the controller 500-1 may compare the light transmittance value of the substrate 110 to the reference light transmittance value and may determine whether the substrate 110 is a normal substrate or a defective substrate in real time, before the substrate 110 is transferred into the chamber CB. For example, when the light transmittance value of the substrate 110 is equal to or lower than the reference light transmittance value, the controller 500-1 may determine the substrate 110 as a normal substrate having the concentration of hydrogen remaining in the amorphous silicon thin film equal to or lower than the normal reference value and may control the transfer part 100 by applying a transfer signal TS to the transfer part 100 so that the transfer part 100 transfers the substrate 110 into the chamber CB, and may control the laser irradiation part 200 by applying the irradiation signal IS to the laser irradiation part 200 so that the laser irradiation part 200 irradiates the excimer laser LB to the substrate 110. When the light transmittance value of the substrate 110 is higher than the reference light transmittance value, the controller 500-1 may determine the substrate 110 as a defective substrate having the concentration of hydrogen remaining in the amorphous silicon thin film higher than the normal reference value and the controller 500-1 may control the transfer part 100 by applying the transfer signal TS to the transfer part 100 so that the transfer part 100 does not transfer the substrate 110 into the chamber CB, or may control the laser irradiation part 200 by applying the irradiation signal IS to the laser irradiation part 200 so that the laser irradiation part 200 does not irradiate the excimer laser LB to the substrate 110.

Figure 4:
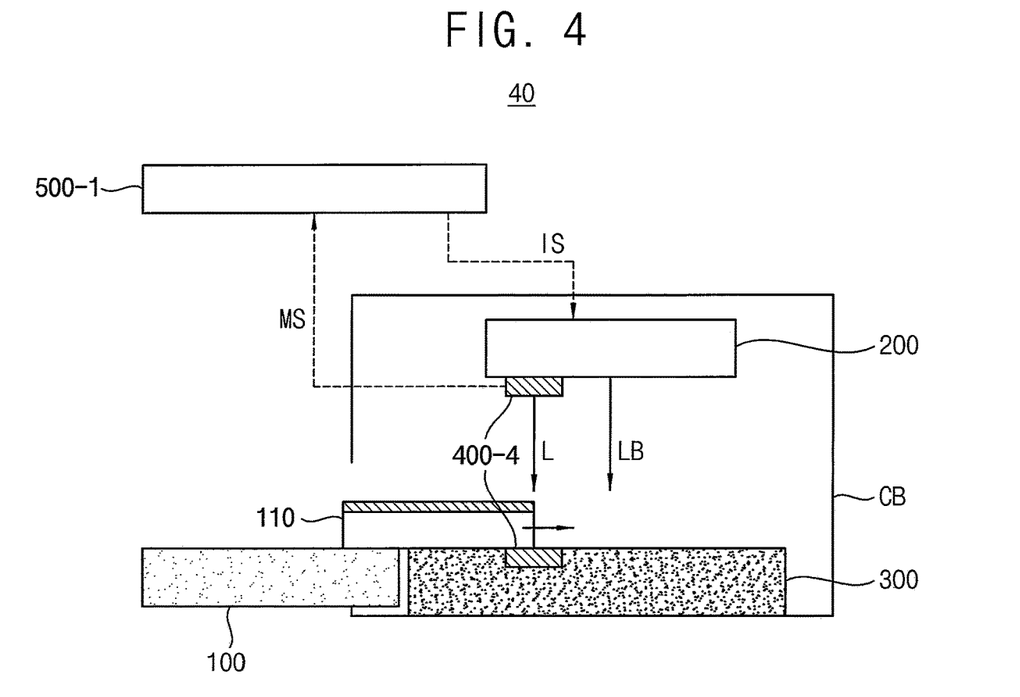
FIG. 4 is a schematic cross-sectional view illustrating a laser crystallization system according to an embodiment.

FIG. 4 is a schematic cross-sectional view illustrating a laser crystallization system according to an embodiment.

Referring to FIG. 4, the laser crystallization system 40 according to an embodiment may include a transfer part 100, a laser irradiation part 200, a stage 300, a measuring part 400-4 and a controller 500-1. However, since the crystallization system 40 is substantially the same as the laser crystallization system 10 of FIG. 1 except for the measuring part 400-4, the description of the laser crystallization system 40 will emphasize the measuring part 400-4.

The measuring part 400-4 may include a measuring tool capable of measuring a light transmittance value of a substrate 110. As shown in FIG. 4, the measuring part 400-4 may include one or more elements. For example, these elements may comprise an emitter that emits light L with a range of wavelengths and a detector that detects intensity of the light L passing through the substrate 110. In an embodiment, the measuring part 400-4 may include an ultraviolet spectrometer and the detector. Although the measuring part 400-4 is disposed between the laser irradiation part 200 and the inlet of the chamber CB in FIG. 4, the measuring part 400-4 may be disposed at an inlet of a chamber CB, inside a cleaner 600, at an inlet of the cleaner 600, or at an outlet of the cleaner 600.

A laser crystallization system of the inventive concept may use a light reflectance value of a substrate 110 instead of a light transmittance value of the substrate 110. Hereinafter, embodiments of the invention will be described in more detail with reference to the drawings.

Figure 5:
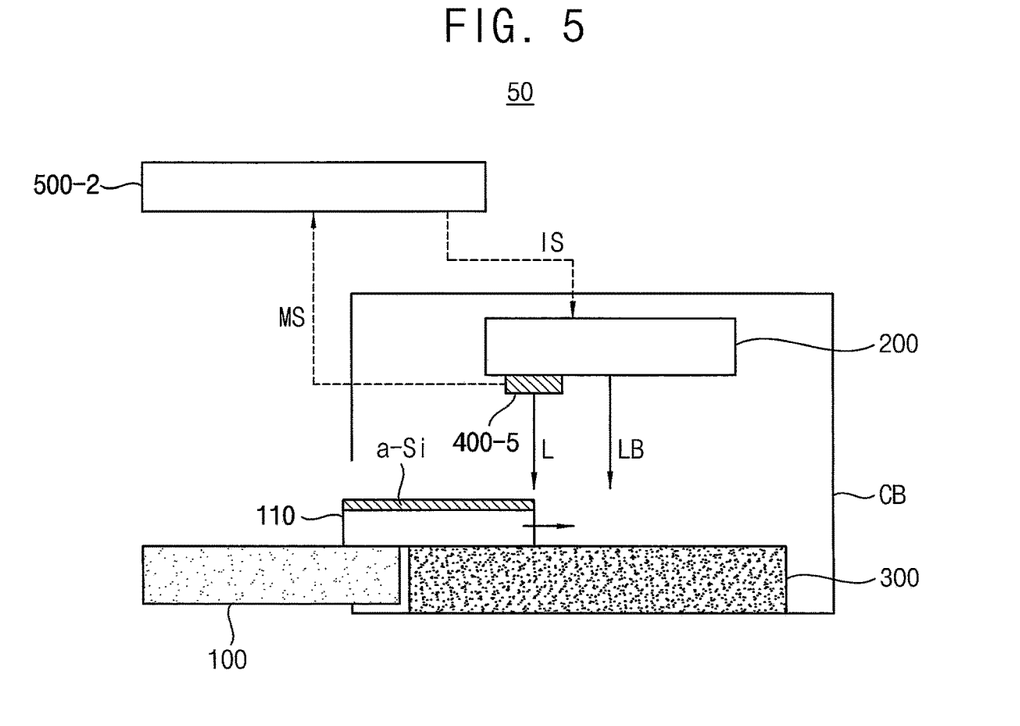
FIG. 5 is a schematic cross-sectional view illustrating a laser crystallization system according to an embodiment.

FIG. 5 is a schematic cross-sectional view illustrating a laser crystallization system according to an embodiment.

Referring to FIG. 5, the laser crystallization system 50 according to an embodiment may include a transfer part 100, a laser irradiation part 200, a stage 300, a measuring part 400-5 and a controller 500-2. Since the transfer part 100, the laser irradiation part 200 and the stage 300 of the laser crystallization system 50 are substantially the same as the laser crystallization system 10 of FIG. 1, the description of the laser crystallization system 50 will emphasize the measuring part 400-5 and the controller 500-2.

The measuring part 400-5 may include a measuring tool capable of measuring a light reflectance value of a substrate 110. The measuring part 400-5 may be disposed between the laser irradiation part 200 and an inlet of a chamber CB and may measure the light reflectance value of the substrate 110 transferred into the chamber CB. The laser crystallization system 50 may further include a cleaner 600. The measuring part 400-5 may measure the light reflectance value of the substrate 110 by being disposed inside the cleaner 600, at an inlet of the cleaner 600, or at an outlet of the cleaner 600.

The light reflectance value of a portion where an amorphous silicon thin film is not normally deposited on the substrate 110 may be lower than the light reflectance value of a portion where the amorphous silicon thin film is normally deposited on the substrate 110. The light reflectance value of the substrate 110 having a high concentration of hydrogen remaining in the amorphous silicon thin film may be lower than the light reflectance value of the substrate 110 having a low concentration of hydrogen remaining in the amorphous silicon thin film. That is, the light reflectance value of a defective substrate may be lower than the light reflectance value of a normal substrate.

The controller 500-2 may receive a measurement signal MS including the light reflectance value of the substrate 110 on which the amorphous silicon thin film is deposited from the measuring part 400-5 and may compare the light reflectance value of the substrate 110 to a reference reflectance value. The controller 500-2 may determine whether the substrate 110 is a normal substrate or a defective substrate in real time by comparing the light reflectance value of the substrate 110 to the reference reflectance value. The controller 500-2 may control the laser irradiation part 200. For example, when the light reflectance value of the substrate 110 is equal to or higher than the reference reflectance value, the controller 500-2 may determine the substrate 110 as a normal substrate having a concentration of hydrogen remaining in the amorphous silicon thin film equal to or lower than the normal reference value and may control the laser irradiation part 200 by applying an irradiation signal IS to the laser irradiation part 200 so that the laser irradiation part 200 irradiates an excimer laser LB to the substrate 110. When the light reflectance value of the substrate 110 is higher than the reference reflectance value, the controller 500-2 may determine the substrate 110 as a defective substrate having the concentration of hydrogen remaining in the amorphous silicon thin film higher than the normal reference value and may control the laser irradiation part 200 by applying the irradiation signal IS to the laser irradiation part 200 so that the laser irradiation part 200 does not irradiate the excimer laser LB to the substrate 110.

The controller 500-2 may also control the transfer part 100 when the measuring part 400-5 is disposed outside the chamber CB. For example, the measuring part 400-5 disposed inside the cleaner 600, at the inlet of the cleaner 600, or at the outlet of the cleaner 600 may measure the light reflectance value of the substrate 110 before the substrate 110 is transferred into the chamber CB, and may transmit the measurement signal MS including the light reflectance value to the controller 500-2. Therefore, the controller 500-2 may also control the transfer part 100 because the controller 500-2 may compare the light reflectance value of the substrate 110 to a reference reflectance value, and may determine whether the substrate 110 is a normal substrate or a defective substrate in real time before the substrate 110 is transferred into the chamber CB. For example, when the light reflectance value of the substrate 110 is equal to or higher than the reference reflectance value, the controller 500-2 may determine the substrate 110 as a normal substrate having the concentration of hydrogen remaining in the amorphous silicon thin film equal to or higher than the normal reference value and may control the transfer part 100 by applying a transfer signal TS to the transfer part 100 so that the transfer part 100 transfers the substrate 110 into the chamber CB, and may control the laser irradiation part 200 by applying the irradiation signal IS to the laser irradiation part 200 so that the laser irradiation part 200 irradiates the excimer laser LB to the substrate 110. When the light reflectance value of the substrate 110 is lower than the reference reflectance value, the controller 500-2 may determine the substrate 110 as a defective substrate having the concentration of hydrogen remaining in the amorphous silicon thin film higher than the normal reference value and may control the transfer part 100 by applying the transfer signal TS to the transfer part 100 so that the transfer part 100 does not transfer the substrate 110 into the chamber CB, or may control the laser irradiation part 200 by applying the irradiation signal IS to the laser irradiation part 200 so that the laser irradiation part 200 does not irradiate the excimer laser LB to the substrate 110.

Although not shown in the drawings, an element may be added to a lower portion of the amorphous silicon thin film. For example, a buffer layer may be formed to prevent penetration of impurity elements from a surface and to planarize a surface. For example, a metal layer may be formed to improve performance of a display device. In other embodiments, the light reflectance value of the substrate 110 may also vary when the structure of the substrate 110 is changed. Even if the structure of the substrate 110 is changed, the laser crystallization system 50 may be performed by changing the reference reflectance value.

In an embodiment, the reference reflectance value may be set to a minimum light reflectance value to decide the substrate 110 as a normal substrate. The controller 500-2 may receive the measurement signal MS including the light reflectance value of the substrate 110 on which the amorphous silicon thin film is deposited from the measuring part 400-5 and may compare the light reflectance value of the substrate 110 to the minimum light reflectance value. The controller 500-2 may determine whether the substrate 110 is a normal substrate or a defective substrate in real time by comparing the light reflectance value of the substrate 110 to the minimum light reflectance value. The controller 500-2 may control the laser irradiation part 200. For example, when the light reflectance value of the substrate 110 is equal to or higher than the minimum light reflectance value, the controller 500-2 may determine the substrate 110 as a normal substrate having the concentration of hydrogen remaining in the amorphous silicon thin film equal to or lower than the normal reference value and may control the laser irradiation part 200 by applying the irradiation signal IS to the laser irradiation part 200 so that the laser irradiation part 200 irradiates the excimer laser LB to the substrate 110. When the light reflectance value of the substrate 110 is lower than the minimum light reflectance value, the controller 500-2 may determine the substrate 110 as a defective substrate having the concentration of hydrogen remaining in the amorphous silicon thin film higher than the normal reference value and may control the laser irradiation part 200 by applying the irradiation signal IS to the laser irradiation part 200 so that the laser irradiation part 200 does not irradiate the excimer laser LB to the substrate 110.

In an embodiment, the reference reflectance value is set to an average value of light reflectance values of previous substrates. The controller 500-2 may receive the measurement signal MS including the light reflectance value of the substrate 110 on which the amorphous silicon thin film is deposited from the measuring part 400-5 and may compare the light reflectance value of the substrate 110 to the average value of light reflectance values of previous substrates. The controller 500-2 may determine whether the substrate 110 is a normal substrate or a defective substrate in real time by comparing the light reflectance value of the substrate 110 to the average value of light reflectance values of previous substrates. The controller 500-2 may control the laser irradiation part 200. For example, when the light reflectance value of the substrate 110 is equal to or higher than the average value of light reflectance values of previous substrates, the controller 500-2 may determine the substrate 110 as a normal substrate having the concentration of hydrogen remaining in the amorphous silicon thin film equal to or lower than the normal reference value and may control the laser irradiation part 200 by applying the irradiation signal IS to the laser irradiation part 200 so that the laser irradiation part 200 irradiates the excimer laser LB to the substrate 110. When the light reflectance value of the substrate 110 is lower than the average value of light reflectance values of previous substrates, the controller 500-2 may determine the substrate 110 as a defective substrate having the concentration of hydrogen remaining in the amorphous silicon thin film higher than the normal reference value and may control the laser irradiation part 200 by applying the irradiation signal IS to the laser irradiation part 200 so that the laser irradiation part 200 does not irradiate the excimer laser LB to the substrate 110.

The average value of the light reflectance values of previous substrates may be used especially when it is difficult to use the minimum light reflectance value. For example, a process condition such as a size or a thickness of a substrate entered into the crystallization process or a thickness of the amorphous silicon thin film may be set to be varied for each process, accordingly the controller 500-2 may set the minimum light reflectance value to be varied for each process condition. The average value of light reflectance values of previous substrates produced in each process may be used. However, embodiments of the inventive concept are not limited thereto, and the average value of the light reflectance values of previous substrates may be variously set as necessary. Further, the reference reflectance value may be variously set as necessary except for the minimum light reflectance value and the average value of the light reflectance values of previous substrates.

In the above, the laser crystallization system 50 which determines the substrate 110 as a defective substrate by using the light transmittance value of the substrate 110 and does not perform the crystallization process about the defective substrate has been described. However, the inventive concept is not limited thereto. For example, the laser crystallization system 50 may determine that the amorphous silicon thin film is not deposited properly when the light reflectance value of the substrate 110 is lower than the reference reflectance value, and may control the laser irradiation part 200 by applying the irradiation signal IS to the laser irradiation part 200 so that the laser irradiation part 200 does not irradiate the excimer laser LB to the substrate 110.

Figure 6:
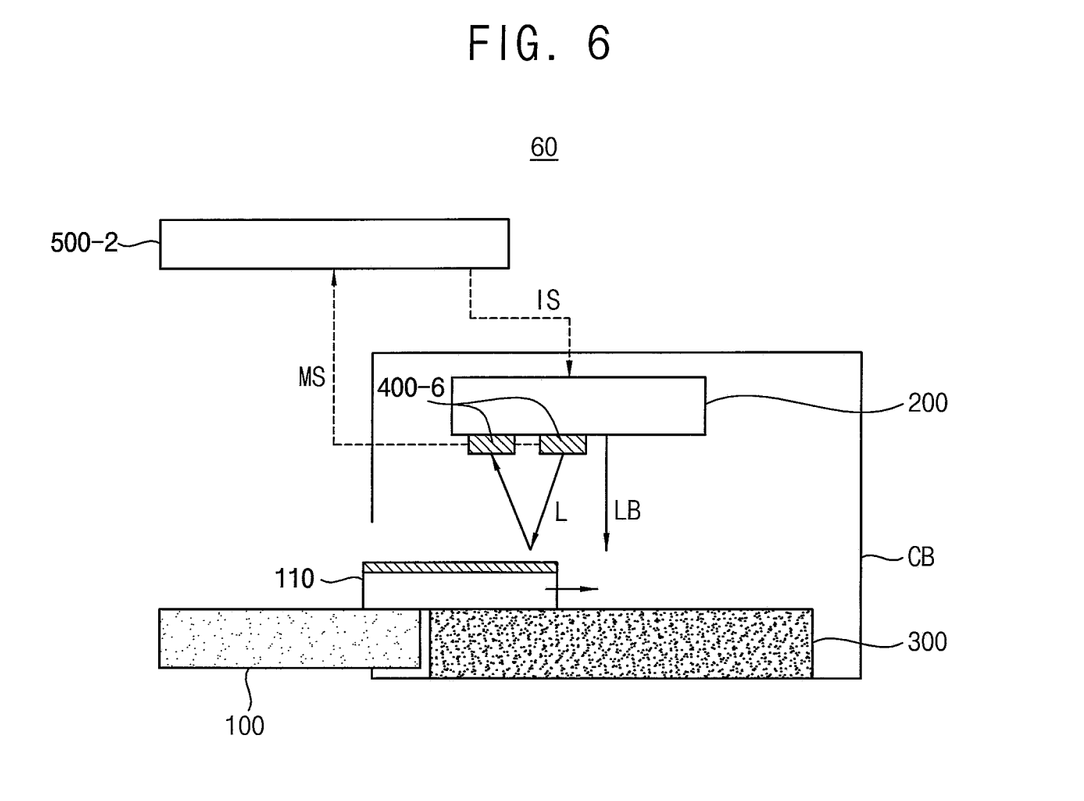
FIG. 6 is a schematic cross-sectional view illustrating a laser crystallization system according to an embodiment.

FIG. 6 is a schematic cross-sectional view illustrating a laser crystallization system according to an embodiment.

Referring to FIG. 6, the laser crystallization system 60 according to an embodiment may include a transfer part 100, a laser irradiation part 200, a stage 300, a measuring part 400-6 and a controller 500-2. However, since the crystallization system 60 is substantially the same as the laser crystallization system 50 of FIG. 5 except for the measuring part 400-6, the description of the laser crystallization system 60 will emphasize the measuring part 400-6.

The measuring part 400-6 may include a measuring tool capable of measuring a light reflectance value of a substrate 110. As shown in FIG. 6, the measuring part 400-6 may include one or more elements. For example, the elements may include an emitter that emits light L with a range of wavelengths and a detector that detects intensity of the light L passing through the substrate 110. Although the measuring part 400-6 is disposed between the laser irradiation part 200 and the inlet of the chamber CB in FIG. 6, the measuring part 400-6 may be disposed at an inlet of a chamber CB, inside a cleaner 600, at an inlet of the cleaner 600, or at an outlet of the cleaner 600.

Figure 7:
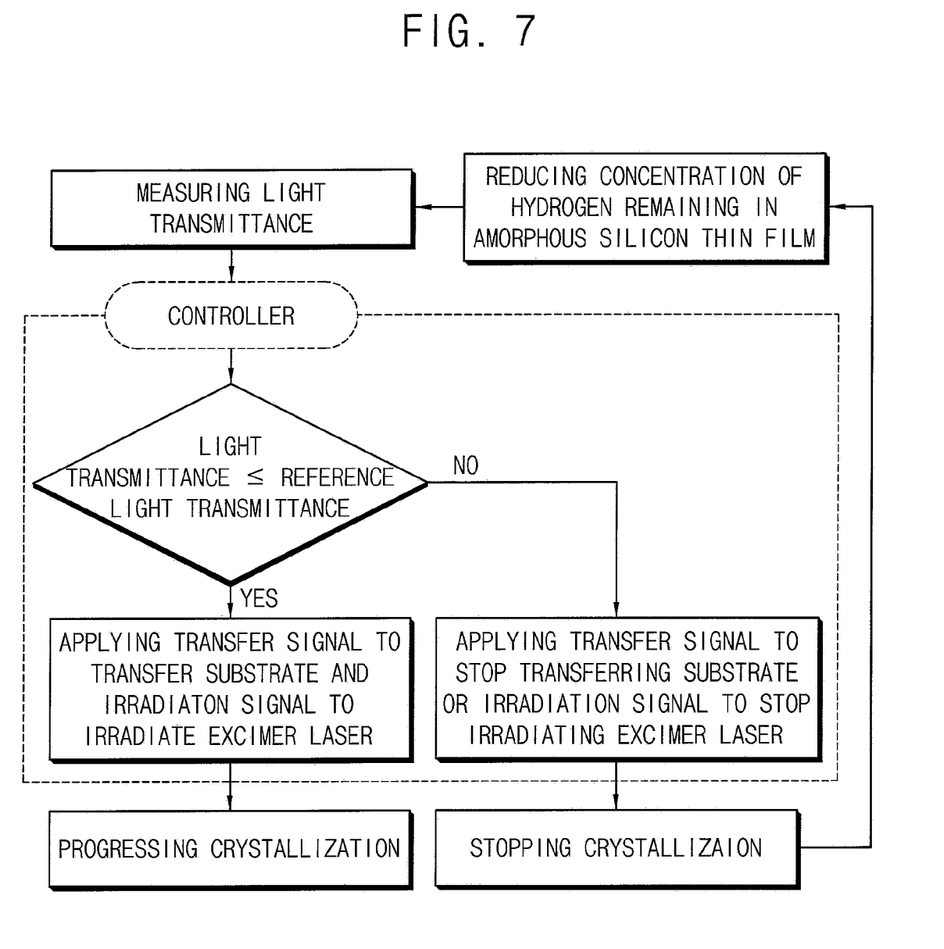
FIG. 7 is a flowchart illustrating a laser crystallization method according to embodiments.

FIG. 7 is a flowchart illustrating a laser crystallization method according to embodiments.

Referring to FIG. 7, the laser crystallization method according to embodiments may include measuring a light transmittance value of a substrate on which an amorphous silicon thin film is deposited, and comparing the light transmittance value to a reference light transmittance value. The laser crystallization method may further include forming a polycrystalline silicon thin film by crystallizing the amorphous silicon thin film by irradiating an excimer laser to the substrate when the light transmittance value of the substrate is equal to or lower than the reference light transmittance value. The laser crystallization method may further include controlling not to irradiate the excimer laser to the substrate when the light transmittance value of the substrate is higher than the reference light transmittance value.

In embodiments, the laser crystallization method may further include reducing a concentration of hydrogen remaining in the amorphous silicon thin film. As shown in FIG. 7, when the light transmittance value of the substrate is higher than the reference light transmittance value, the substrate may be determined as a defective substrate having a higher concentration of hydrogen remaining in the amorphous silicon thin film than a normal reference value, and the laser crystallization method may include controlling not to irradiate the excimer laser to the substrate. After that, the laser crystallization method may further include reducing the concentration of hydrogen remaining in the amorphous silicon thin film. Reducing the concentration of hydrogen remaining in the amorphous silicon thin film may include a heat treatment process, and the heat treatment process may be performed by heat treating the substrate on which the amorphous silicon thin film is deposited for a predetermined time in a furnace. As the temperature and time of the heat treatment process increase, the concentration of hydrogen remaining in the amorphous silicon thin film may be reduced, and measurement of the light transmittance value of the substrate may be performed again.

In an embodiment, the reference light transmittance value may be set to a maximum light transmittance value to decide the substrate as a normal substrate. In an embodiment, the reference light transmittance value may be set to an average value of light transmittance values of previous substrates.

The inventive concept may be applied to a display device and an electronic device including the display device. For example, the inventive concept may be applied to a cellular phone, a smart phone, a video phone, a smart pad, a smart watch, a tablet PC, a car navigation system, a television, a computer monitor, a laptop, a head mounted display device, an MP3 player, etc.

The foregoing is illustrative of embodiments and is not to be construed as limiting thereof. Although some embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the claims.

What is claimed is:

1. A laser crystallization method comprising:
    measuring a light transmittance value of a substrate on which an amorphous silicon thin film is deposited;
    comparing the light transmittance value to a reference light transmittance value;
    forming a polycrystalline silicon thin film by crystallizing the amorphous silicon thin film by irradiating an excimer laser to the substrate when the light transmittance value is equal to or lower than the reference light transmittance value; and
    controlling not to irradiate the excimer laser to the substrate when the light transmittance value is higher than the reference light transmittance value.

2. The laser crystallization method of claim 1, further comprising:
    reducing a concentration of hydrogen remaining in the amorphous silicon thin film when the light transmittance value is higher than the reference light transmittance value.

3. The laser crystallization method of claim 1, wherein the reference light transmittance value is set to a maximum light transmittance value to decide the substrate as a normal substrate.

4. The laser crystallization method of claim 1, wherein the reference light transmittance value is set to an average value of light transmittance values of previous substrates.

* * * * *